United States Patent
Lee et al.

(10) Patent No.: US 11,422,192 B2
(45) Date of Patent: Aug. 23, 2022

(54) METHOD AND APPARATUS FOR ESTIMATING STATE OF HEALTH OF BATTERY

(71) Applicants: Samsung SDI Co., Ltd., Yongin-si (KR); POSTECH Research and Business Development Foundation, Pohang-si (KR)

(72) Inventors: Jang-Woo Lee, Yongin-si (KR); Jungsoo Kim, Pohang-si (KR); Huiyong Chun, Pohang-si (KR); Soohee Han, Pohang-si (KR); Tae-Kyung Lee, Yongin-si (KR)

(73) Assignees: Samsung SDI Co., Ltd., Yongin-si (KR); POSTECH Research and Business Development Foundation, Pohang-si (KR)

( * ) Notice: Subject to any disclaimer, the term of this patent is extended or adjusted under 35 U.S.C. 154(b) by 45 days.

(21) Appl. No.: 17/064,013

(22) Filed: Oct. 6, 2020

(65) Prior Publication Data

US 2021/0132151 A1    May 6, 2021

Related U.S. Application Data

(60) Provisional application No. 62/911,874, filed on Oct. 7, 2019.

(30) Foreign Application Priority Data

Oct. 5, 2020  (KR) .................. 10-2020-0128013

(51) Int. Cl.
*G01R 31/367* (2019.01)
*G06N 3/08* (2006.01)
(Continued)

(52) U.S. Cl.
CPC ........ *G01R 31/367* (2019.01); *G01R 31/392* (2019.01); *G06N 3/04* (2013.01); *G06N 3/08* (2013.01)

(58) Field of Classification Search
None
See application file for complete search history.

(56) References Cited

U.S. PATENT DOCUMENTS 10,466,304 B2   11/2019  Sung
10,527,678 B2   1/2020   Lee
(Continued)

FOREIGN PATENT DOCUMENTS

KR       10-0372879 B1    2/2003
KR    10-2016-0085070 A   7/2016
(Continued)

OTHER PUBLICATIONS

Estimation of Li-ion Battery State of Health based on Multilayer Preception: as an EV Application 2018, IFAC PapersOnline 51-28, 392-397 (Year: 2018).*

(Continued)

*Primary Examiner* — Roy Y Yi
(74) *Attorney, Agent, or Firm* — Lewis Roca Rothgerber Christie LLP

(57) ABSTRACT

A method of estimating a state of health of a battery, the method being performed by a computing apparatus, the method including: preparing a trained artificial neural network; generating input data by measuring at least one parameter of a battery; acquiring a plurality of output values each corresponding to a plurality of classes by inputting the input data into the trained artificial neural network; and generating a state of health estimation value of the battery using a plurality of preset health state sections each corre- (Continued)

sponding to the plurality of classes and the plurality of output values each corresponding to the plurality of classes.

18 Claims, 16 Drawing Sheets

(51) Int. Cl.
    *G06N 3/04*     (2006.01)
    *G01R 31/392*     (2019.01)

(56) References Cited

U.S. PATENT DOCUMENTS

2016/0059733 A1*   3/2016   Hettrich  ............... H04W 4/029
                                                           701/2
2017/0294689 A1   10/2017   Wada et al.

FOREIGN PATENT DOCUMENTS

| KR | 10-2017-0016956 A | 2/2017 |
|---|---|---|
| KR | 10-2018-0043048 A | 4/2018 |
| KR | 10-1852664 B1 | 4/2018 |

OTHER PUBLICATIONS

Ahmed, R., et al., "Reduced-Order Electrochemical Model Parameters Identification and SOC Estimation for Healthy and Aged Li-Ion Batteries Part I: Parameterization Model Development for Healthy Batteries," IEEE Journal of Emerging and Selected Topics in Power Electronics, vol. 2, No. 3, pp. 659-677, 2014.

Atkins, P., et al., "Atkins' Physical Chemistry," 2006, 1085 pages.

Askarzadeh, A., et al., "An Innovative Global Harmony Search Algorithm for Parameter Identification of a PEM Fuel Cell Model," IEEE Transactions on Industrial Electronics, vol. 59, No. 9, pp. 3473-3480, Sep. 2012.

Bartlett, A., et al., "Electrochemical Model-Based State of Charge and Capacity Estimation for a Composite Electrode Lithium-Ion Battery," IEEE Transactions on Control Systems Technology, vol. 24, No. 2, pp. 384-399, Mar. 2016.

Beheshti, Z., "A Review of Population-based Meta-Heuristic Algorithm," International Journal of Advances in Soft Computing Applications, vol. 5, No. 1, pp. 1-35, Mar. 2013.

Chun, H., et al., "Adaptive Exploration Harmony Search for Effective Parameter Estimation in an Electrochemical Lithium-Ion Battery Model," IEEE Access, vol. 7, 2019, 11 pages.

Dunn, B., et al., "Electrical Energy Storage for the Grid: A Battery of Choices," Science, vol. 334, No. 6058, pp. 928-935, Nov. 2011.

Doyle, M., et al., "Modeling of Galvanostatic Charge and Discharge of the Lithium/Polymer/Insertion Cell," Journal of The Electrochemical Society, vol. 140, No. 6, pp. 1526-1533, Jun. 1993.

Dao, T., et al., "Simplification and order reduction of lithium-ion battery model based on porous-electrode theory," Journal of Power Sources, vol. 198, pp. 329-337, 2012.

Eddahech, A., et al., "Behavior and state-of-health monitoring of Li-ion batteries using impedance spectroscopy and recurrent neural networks," Electrical Power & Energy Systems, vol. 42, No. 1, pp. 487-494, 2012.

Forman, J.C., et al., "Genetic identification and fisher identifiability analysis of the Doyle-Fuller-Newman model from experimental cycling of a LiFePO4 cell," Journal of Power Sources, vol. 210, pp. 263-275, 2012.

Gray, W.G., et al., "On the Theorems for Local Volume Averaging of Multiphase Systems," International Journal of Multiphase Flow, vol. 3, No. 4, pp. 333-340, 1977.

Hannan, M.A., et al., "A review of lithium-ion battery state of charge estimation and management system in electric vehicle applications: Challenges and recommendations," Renewable and Sustainable Energy Reviews, vol. 78, pp. 834-854, 2017.

Hochreiter, S., et al., "Long Short-Term Memory," Neural Computation, vol. 9, No. 8, pp. 1735-1780, 1997.

Ioffe, S., et al., "Batch Normalization: Accelerating Deep Network Training by Reducing Internal Covariate Shift," arXiv preprint arXiv:1502.03167, 2015, 11 pages.

Kabir, M. M., et al., "Degradation mechanisms in Li-ion batteries: a state-of-the-art review," International Journal of Energy Research, vol. 41, No. 14, pp. 1963-1986, 2017.

Khalik, Z., et al., "On Trade-offs Between Computational Complexity and Accuracy of Electrochemistry-based Battery Models," 58th IEEE Conference on Decision and Control, 2019, pp. 7740-7745.

Kim, J., et al., "Data-Driven State of Health Estimation of Li-Ion Batteries With RPT-Reduced Experimental Data," IEEE Access, vol. 7, 2019, 11 pages.

Kim, M., et al., "Data-efficient parameter identification of electrochemical lithium-ion battery model using deep Bayesian harmony search," Applied Energy, vol. 254, 2019, 11 pages.

Kim, J., et al., "Data-driven State of Health Estimation of Li-ion Batteries with RPT-Reduced Experimental Data," IEEE Access, vol. 4, 2016, 12 pages.

Li, Q., et al., "Parameter Identification for PEM Fuel-Cell Mechanism Model Based on Effective Informed Adaptive Particle Swarm Optimization," IEEE Transactions on Industrial Electronics, vol. 58, No. 6, pp. 2410-2419, Jun. 2011.

Li, J., et al., "Parameter Identification of Lithium-Ion Batteries Model to Predict Discharge Behaviors Using Heuristic Algorithm," Journal of The Electrochemical Society, vol. 163, No. 8, pp. A1646-A1652, 2016.

Lin, H., et al., "Estimation of Battery State of Health Using Probabilistic Neural Network," IEEE Transactions on Industrial Informatics, vol. 9, No. 2, pp. 679-685, May 2013.

Liu, D., et al., "Prognostics for state of health estimation of lithium-ion batteries based on combination Gaussian process functional regression," Microelectronics Reliability, vol. 53, No. 6, pp. 832-839, 2013.

Liu, J., et al., "An Adaptive Recurrent Neural Network for Remaining Useful Life Prediction of Lithium-ion Batteries," Annual Conference of the Prognostics and Health Management Society, 2010, 10 pages.

Loshchilov, I., et al., "SGDR: Stochastic Gradient Descent with Warm Restarts," Published as a conference paper at ICLR, 2017, arXiv preprint arXiv:1608.03983, 16 pages.

Lu, L., et al., "A review on the key issues for lithium-ion battery management in electric vehicles," Journal of Power Sources, vol. 226, pp. 272-288, 2013.

Lyu, C., et al., "In situ monitoring of lithium-ion battery degradation using an electrochemical model," Applied Energy, vol. 250, pp. 685-696, 2019.

Moura, S.J., et al., "Adaptive Partial Differential Equation Observer for Battery State-of-Charge/State-of-Health Estimation Via an Electrochemical Model," Journal of Dynamic Systems, Measurement, and Control, vol. 136, No. 1, Jan. 2014, 11 pages.

Nuhic, A, et al., "Health diagnosis and remaining useful life prognostics of lithium-ion batteries using data-driven methods," Journal of Power Sources, vol. 239, pp. 680-688, 2013.

Park, S., et al., "Optimal Experimental Design for Parameterization of an Electrochemical Lithium-Ion Battery Model," Journal of The Electrochemical Society, vol. 165, No. 7, pp. A1309-A1323, 2018.

Rahimi-Eichi, H., et al., "Battery Management System: An Overview of Its Application in the Smart Grid and Electric Vehicles," IEEE Industrial Electronics Magazine, vol. 7, No. 2, pp. 4-16, Jun. 2013.

Rahman, M.A., et al., "Electrochemical model parameter identification of a lithium-ion battery using particle swarm optimization method," Journal of Power Sources, vol. 307, pp. 86-97, 2016.

Ramadass, P., et al., "Development of First Principles Capacity Fade Model for Li-Ion Cells," Journal of The Electrochemical Society, vol. 151, No. 2, pp. A196-A203, 2004.

Ramadesigan, V., et al., "Parameter Estimation and Capacity Fade Analysis of Lithium-Ion Batteries Using Reformulated Models," Journal of The Electrochemical Society, vol. 158, No. 9, pp. A1048-A1054, 2011.

(56) References Cited

OTHER PUBLICATIONS

Santhanagopalan, S., et al., "Review of models for predicting the cycling performance of lithium ion batteries," Journal of Power Sources, vol. 156, No. 2, pp. 620-628, 2006.

Srivastava, N., et al., "Dropout: A Simple Way to Prevent Neural Networks from Overfitting," Journal of Machine Learning Research, vol. 15, No. 1, pp. 1929-1958, 2014.

Torchio, M., et al., "Lionsimba: A Matlab Framework Based on a Finite Volume Model Suitable for Li-Ion Battery Design, Simulation, and Control," Journal of The Electrochemical Society, vol. 163, No. 7, pp. A1192- A1205, 2016.

Uddin, K., et al., "Characterising Lithium-Ion Battery Degradation through the Identification and Tracking of Electrochemical Battery Model Parameters," Batteries, vol. 2, 2016, 17 pages.

Wang, Q., et al., "A review of lithium ion battery failure mechanisms and fire prevention strategies," Progress in Energy and Combustion Science, vol. 73, pp. 95-131, 2019.

Whitley, D., "A genetic algorithm tutorial," Statistics and Computing, vol. 4, No. 2, pp. 65-85, 1994.

Xia, L., et al., "A computationally efficient implementation of a full and reduced-order electrochemistry-based model for Li-ion batteries," Applied Energy, vol. 208, pp. 1285-1296, 2017.

Xiong, R., et al., "An electrochemical model based degradation state identification method of Lithium-ion battery for all-climate electric vehicles application," Applied Energy, vol. 219, pp. 264-275, 2018.

Yang, X., et al., "Parameter Identification of Electrochemical Model for Vehicular Lithium-Ion Battery Based on Particle Swarm Optimization," Energies, vol. 10, No. 11, 2017, 16 pages.

You, G., et al., "Diagnosis of Electric Vehicle Batteries Using Recurrent Neural Networks," IEEE Transactions on Industrial Electronics, vol. 64, No. 6, pp. 4885-4893, Jun. 2017.

Zhang, L., et al., "Multi-objective optimization of lithium-ion battery model using genetic algorithm approach," Journal of Power Sources, vol. 270, pp. 367-378, 2014.

* cited by examiner

CURRENT PROFILE

SYNTHESIZED VOLTAGE DATA

SYNTHESIZED
TEMPERATURE DATA

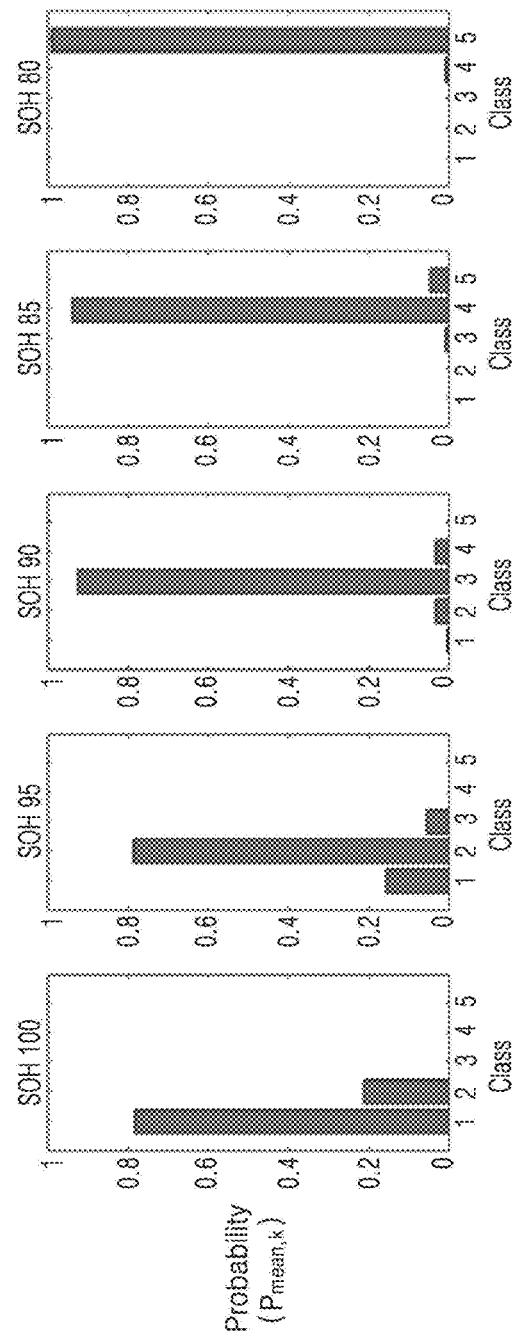

METHOD AND APPARATUS FOR ESTIMATING STATE OF HEALTH OF BATTERY

CROSS-REFERENCE TO RELATED APPLICATIONS

The present application claims priority to and the benefit of U.S. Provisional Application Ser. No. 62/911,874, filed on Oct. 7, 2019 and Korean Patent Application No. 10-2020-0128013 filed on Oct. 5, 2020, the entire contents of each of which are incorporated herein by reference.

BACKGROUND

1. Field

One or more embodiments relate to a method and apparatus for estimating a state of health of a battery, including a method of estimating a state of health of a battery based on data that may be measured directly from the battery using a trained artificial neural network, a computer program, and an apparatus therefor.

2. Description of Related Art

In a state of health (SOH) estimation algorithm according to the related art, a method of estimating a SOH by collecting data on the life of a battery or deterioration, offline, in advance, storing and using the data in the form of a lookup table or converting the data into an equation that characterizes the life of the battery and performing calculations according to a usage pattern, or estimating the capacity and internal resistance of the battery online using a battery model and an estimation algorithm, or a combination thereof, such as an offline method and an online method, is used.

However, if the SOH is outside the range of data acquired offline or outside the range of the battery model that can be estimated online, the SOH cannot be estimated, and this problem cannot be solved even if the offline and online methods are combined.

SUMMARY

One or more embodiments include a method of estimating a state of health (SOH) of a battery based on data that may be measured directly from the battery using a trained artificial neural network, a computer program, and an apparatus therefor.

Additional aspects will be set forth in part in the description which follows and, in part, will be apparent from the description, or may be learned by practice of the presented embodiments of the disclosure.

According to one or more embodiments, a method of estimating a state of health of a battery, the method being performed by a computing apparatus, the method includes preparing a trained artificial neural network, generating input data by measuring at least one parameter of a battery, acquiring a plurality of output values corresponding to a plurality of classes by inputting the input data into the trained artificial neural network, and generating a state of health estimation value of the battery using a plurality of preset health state sections corresponding to the plurality of classes and the plurality of output values corresponding to the plurality of classes.

The at least one parameter may include a voltage of the battery and a current of the battery.

The at least one parameter may include a voltage of the battery, a current of the battery, and a temperature of the battery.

The generating of the input data may include measuring the at least one parameter of the battery in operation in accordance with a preset sampling period and generating the input data based on measurement values of the at least one parameter measured for a preset first time.

The generating of the input data may include generating measurement values of the at least one parameter by measuring the at least one parameter of the battery in operation in accordance with a preset sampling period, generating a plurality of input sub data based on measurement values of the at least one parameter generated for a preset first time after a preset second time has elapsed, and generating the input data based on the plurality of input sub data.

The plurality of output values corresponding to the plurality of classes may be probability values that the input data belongs to each of the plurality of classes.

A state of health estimation value of the battery may be calculated by multiplying representative values of the plurality of health state sections each corresponding to the plurality of classes and the plurality of output values each corresponding to the plurality of classes to compute a plurality of products and summing the plurality of products.

The preparing of the trained artificial neural network may include generating an artificial neural network, preparing measurement data acquired by measuring the at least one parameter of the battery in each of the plurality of preset health state sections, generating a plurality of training data labeled with a class to which they belong based on the measurement data and the corresponding preset health state sections, and training the artificial neural network using the plurality of training data to prepare the trained artificial neural network.

The preparing of the plurality of training data may include preparing a battery electrochemical model including model parameters, generating a plurality of model parameter data of the battery electrochemical model each corresponding to the plurality of preset health state sections using the measurement data, generating a plurality of synthesized voltage data each corresponding to the plurality of preset health state sections by inputting current data into the battery electrochemical model to which each of the plurality of model parameter data is applied, and generating the plurality of training data based on the current data and the plurality of synthesized voltage data.

The preparing of the plurality of training data may include further generating a plurality of synthesized temperature data each corresponding to the plurality of preset health state sections by inputting current data into the battery electrochemical model to which each of the plurality of model parameter data is applied, and generating the plurality of training data based on the current data, the plurality of synthesized voltage data, and the plurality of synthesized temperature data.

The artificial neural network may be generated based on a multi-layer perceptron (MLP).

The trained artificial neural network may include an input layer, at least one hidden layer, and an output layer. The output layer may include a softmax function that outputs a probability that the input data input into the input layer belongs to each of the plurality of classes.

According to one or more embodiments, a computer program is stored in a medium so as to perform the method of estimating a state of health of a battery described above using a computing apparatus.

According to one or more embodiments, an apparatus for estimating a state of health of a battery, the apparatus being performed by a computing apparatus, the apparatus includes memory configured to store input data generated by measuring a trained artificial neural network and at least one parameter of the battery, and at least one processor configured to acquire a plurality of output values corresponding to a plurality of classes by inputting the input data into the trained artificial neural network and to estimate a state of health value of the battery using a plurality of preset health state sections corresponding to the plurality of classes and the plurality of output values corresponding to the plurality of classes.

The at least one parameter may include a voltage of the battery and a current of the battery or may include a voltage of the battery, a current of the battery, and a temperature of the battery.

The input data may be generated based on measurement values of the at least one parameter generated by measuring the at least one parameter of the battery in operation in accordance with a preset sampling period for a preset first time.

The input data may be generated based on a plurality of input sub data. The plurality of input sub data may be generated based on measurement values of the at least one parameter generated by measuring the at least one parameter of the battery in operation in accordance with a preset sampling period. Each of the plurality of input sub data may be generated based on measurement values of the at least one parameter generated for a preset first time after a preset second time has elapsed.

The plurality of output values each corresponding to the plurality of classes may be probability values that the input data belongs to each of the plurality of classes.

A state of health value of the battery may be calculated by multiplying representative values of the plurality of health state sections each corresponding to the plurality of classes and the plurality of output values each corresponding to the plurality of classes to compute a plurality of products and summing the plurality of products.

The trained artificial neural network may include an input layer, at least one hidden layer, and an output layer, and the output layer may include a softmax function that outputs a probability that the input data input into the input layer belongs to each of the plurality of classes.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 11A and 11B illustrate a class probability distribution of an artificial neural network trained using synthesized input data including current data, synthetized voltage data, and synthesized temperature data according to a current profile according to an embodiment.

DETAILED DESCRIPTION

Figure 1:
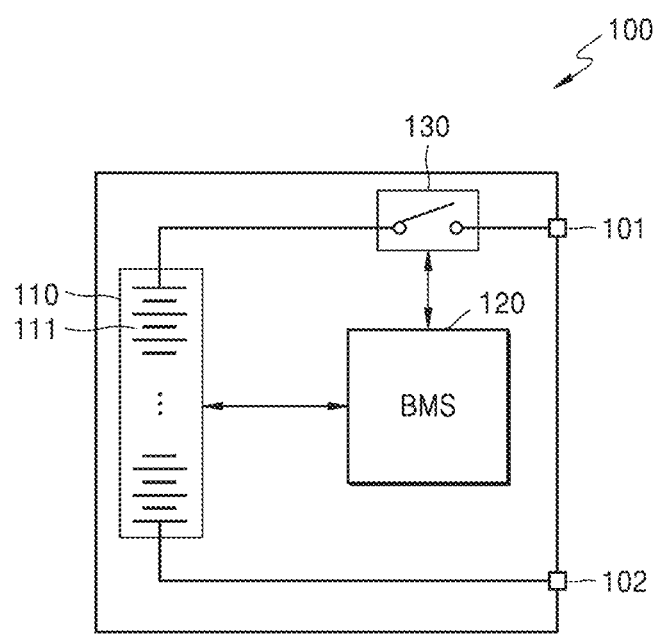
FIG. 1 schematically illustrates a battery pack according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, various embodiments will be described in detail with reference to the accompanying drawings so that those of ordinary skill in the art may easily implement the present disclosure. However, the technical spirit of the present disclosure may be modified in various forms and implemented and thus is not limited to embodiments to be described in the present specification. In the description of embodiments disclosed in the present specification, certain detailed explanations of related art are omitted when it is deemed that they may unnecessarily obscure the essence of the present disclosure. Those components that are the same or are in correspondence are rendered the same reference numeral regardless of the figure number, and a redundant description therewith is omitted.

In the present specification, when an element is referred to as being "connected" to another element, this includes not only the case of being "directly connected" but also the case of being "indirectly connected" to another element interposed therebetween. When an element "includes" another element, it means that another element may be further included rather than excluding another element in addition to the other element unless specifically stated to the contrary.

Some embodiments may be described in functional block configurations and various processing steps. Some or all of these functional blocks may be implemented with various numbers of hardware and/or software components that perform a specific function. For example, the functional blocks of the present disclosure may be implemented by one or more microprocessors or circuit configurations for a certain function. The functional blocks of the present disclosure may be implemented in various programming or scripting languages. The functional blocks of the present disclosure may be implemented as an algorithm executed on one or more processors. Functions performed by the functional blocks of the present disclosure may be performed by a plurality of functional blocks, or functions performed by the plurality of functional blocks in the present disclosure may be performed by a single functional block. In addition, the present disclosure may employ the related art so as to perform electronic environment setting, signal processing, and/or data processing.

FIG. 1 schematically illustrates a battery pack according to an embodiment.

Referring to FIG. 1, a battery pack 100 may include a battery 110, a battery controller (or battery management system) 120, and a switch 130.

The battery 110 may include at least one battery cell 111, and the battery cell 111 may be a rechargeable secondary battery. For example, the battery cell 110 may include at least one selected from the group consisting of a nickel-cadmium battery, a lead acid battery, a nickel metal hydride battery, a lithium ion battery, and a lithium polymer battery.

The number and connection method of the battery cells 111 included in the battery 110 may be determined based on the amount of power and voltage required for the battery pack 100. FIG. 1 shows that the battery cells 111 included in the battery 110 are connected in series for conceptual purposes only, but the battery cells 111 may be connected in parallel with each other, or connected in series and in parallel. FIG. 1 shows that the battery pack 100 includes one battery 110 for conceptual purposes only, but the battery pack 100 may include a plurality of batteries 110 connected in series or in parallel with each other, or connected in series and in parallel. The battery 110 may include only one battery cell 111.

The battery 110 may include a plurality of battery modules each including a plurality of battery cells 111. The battery pack 100 may include a pair of pack terminals 101 and 102 to which an electric load and/or a charging device may be connected.

In the present specification, the battery may be the battery 110 or each of at least one battery cell 111 included in the battery 110 as a target for estimating a state of heath. In the present specification, a method of estimating a state of health of one battery will be described. However, embodiments include a method of estimating a state of health of each of the plurality of battery cells 111 included in the battery 110.

The switch 130 may be connected between the battery 110 and one (for example, 101) of the pair of pack terminals 101 and 102. The switch 130 may be controlled by the battery controller 120.

The battery controller 120 may manage the battery 110. The battery controller 120 may manage a state of charging and a charge/discharge current of the battery 110. For example, the battery controller 120 may measure a cell voltage of each of the battery cells 111 of the battery 110, measure the temperature of the battery 110 and measure the charge/discharge current of the battery 110. The battery controller 120 may equalize the cell voltage of each of the battery cells 111. When the battery 110 is in an overcharged, over-discharged, or high temperature state, the battery controller 120 may detect this state and may open the switch 130 (or otherwise control the switch 130 in accordance with the detected state).

The battery controller 120 may estimate the state of health of the battery 110 by using data measured from the battery 110. The data measured from the battery 110 may include at least one of the cell voltage of each of the battery cells 111, a terminal voltage of the battery 110, the charge/discharge current of the battery cell 110, and the temperature of the battery 110. A method of estimating the state of health of the battery 110 by using the battery controller 120 will be described below in more detail.

Although not shown in FIG. 1, the battery pack 100 may include a battery protection circuit, a fuse, and a current sensor.

Figure 2:
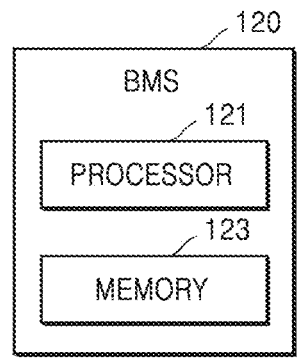
FIG. 2 schematically illustrates the internal configuration of a battery controller according to an embodiment.

FIG. 2 schematically illustrates the internal configuration of the battery controller 120 according to an embodiment.

Referring to FIG. 2, the battery controller 120 may include a processor 121 and memory 123.

The processor 121 may control the overall operation of the battery controller 120. The processor 121 may perform basic arithmetic, logic and input/output operations, and may execute, for example, a program code stored in the memory 123, for example, an artificial neural network trained in advance (e.g., a trained artificial neural network). The processor 121 may store the data in the memory 121 or load the data stored in the memory 121.

The memory 123 that is a recording medium that may be read by the processor 121, may include a permanent mass storage device such as random access memory (RAM), read only memory (ROM), or a disk drive. An operating system and at least one program or application code may be stored in the memory 123. A program code for implementing an artificial neural network trained in advance may be stored in the memory 123 so as to estimate the state of health of the battery according to an embodiment. Input data generated by measuring at least one parameter of the battery 110 may be stored in the memory 123. A program code for additionally training (e.g., further training, retraining or updating) the artificial neural network may be stored in the memory 123 by using input data generated by measuring at least one parameter of the battery 110. At least one parameter of the battery 110 refers to a component or variable such as a terminal voltage, a charge/discharge current and/or ambient temperature of the battery 110.

The battery controller 120 may further include a sensing module for measuring at least one parameter of the battery 110. The battery controller 120 may further include a communication module for communicating with another device such as an electronic control device of a vehicle or a controller of a charging device.

Figure 3:
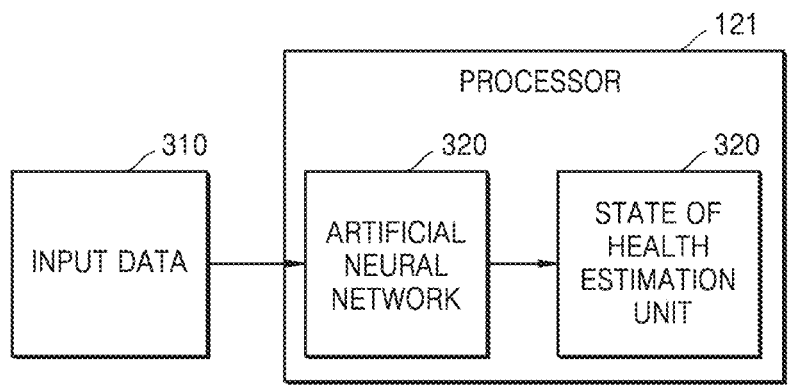
FIG. 3 schematically illustrates the internal configuration of a processor according to an embodiment.

FIG. 3 schematically illustrates the internal configuration of the processor 121 according to an embodiment.

Referring to FIG. 3, the processor 121 may include (e.g., execute or run) an artificial neural network 320 and a state of health estimation unit 330. The artificial neural network 320 and the state of health estimation unit 330 may be implemented by the processor 121.

Input data 310 may be input to the artificial neural network 320. The artificial neural network 320 may output a plurality of output values each corresponding to a plurality of classes in response to the input data 310. The state of health estimation unit 330 may generate a state of health estimation value of the battery 110 based on a plurality of preset health state sections each corresponding to the plurality of output values output by the artificial neural network 320 and the plurality of classes.

The input data 310 may be generated from measurement data acquired by measuring at least one parameter of the battery 110. The at least one parameter may be voltage and current of the battery 110. The at least one parameter may be voltage, current and temperature of the battery 110. The at least one parameter may further include a cumulative use time of the battery 110 or the number of times of charging and discharging.

Hereinafter, embodiments in which at least one parameter of the battery 110 is voltage, current and temperature of the battery 110, will be described. In this case, measurement data acquired by measuring at least one parameter of the battery 110 may include voltage data, current data and temperature data of the battery 110.

The voltage data, current data and temperature data of the battery 110 that are time series data may include voltage values, current values, and temperature values measured every preset sampling period. The preset sampling period may be 1 second, for example. However, the sampling period may be shorter or longer than 1 second. The voltage data, current data, and temperature data of the battery 110 may be referred to as measurement data below.

The input data 310 may include some measurement data corresponding to a preset window size among the measurement data of the battery 110. The window size may correspond to a first time corresponding to L (where L is a natural number) times the sampling period. The input data 310 may be generated based on measurement values (or measured values) of the at least one parameter measured for the preset first time. In another example, the input data 310 may include data acquired by pre-processing measurement data of the battery 110. Pre-processing may include, for example, filtering to reduce or remove noise and/or normalizing to make the average and variance of each of voltage data, current data, and temperature data constant or consistent.

When the input data 310 is input into the artificial neural network 320, the artificial neural network 320 may output a plurality of output values each corresponding to a plurality of classes in response to the input data 310. In the present specification, the plurality of classes may correspond to a plurality of preset health state sections. For example, when the artificial neural network 320 output six output values each corresponding to size classes, first through sixth classes may correspond to a first health state section of 99% to 100%, a second health state section of 89% to 91%, a third health state section of 79% to 81%, a fourth health state section of 69% to 71%, a fifth health state section of 59% to 61%, and a sixth health state section of 49% to 51%, and representative values of the first through sixth health state sections may be 100%, 90%, 80%, 70%, 60%, and 50%, respectively.

The plurality of output values each corresponding to the plurality of classes output by the artificial neural network 320 into which the input data 310 is input, may be probability values that the input data 310 belongs to each of the plurality of classes. In the above example, a first output value may mean a probability value that the state of health of the battery 110 from which the input data 310 is acquired belongs to the first health state section, for example, 99% to 100%, a second output value may mean a probability value that the state of health of the battery 110 from which the input data 310 is acquired belongs to the second health state section, for example, 89% to 91%, a third output value may mean a probability value that the state of health of the battery 110 from which the input data 310 is acquired belongs to the third health state section, for example, 79% to 81%, a fourth output value may mean a probability value that the state of health of the battery 110 from which the input data 310 is acquired belongs to the fourth health state section, for example, 69% to 71%, a fifth output value may mean a probability value that the state of health of the battery 110 from which the input data 310 is acquired belongs to the fifth health state section, for example, 59% to 61%, and a sixth output value may mean a probability value that the state of health of the battery 110 from which the input data 310 is acquired belongs to the sixth health state section, for example, 49% to 51%.

For example, when the input data 310 is data acquired from the battery 110 in a state of health of 80%, the artificial neural network 320 may output a relatively high value for the third output value that corresponds to the probability value belonging to the third health state section, for example, 79% to 81%, and may output relatively very low values for the first, second, and fourth to sixth output values. For example, when the input data 310 is data acquired from the battery 110 in a state of health of 95%, the artificial neural network 320 may output relatively high values for the first and second output values and relatively low values for the third to sixth output values.

The state of health estimation unit 330 may receive the plurality of output values from the artificial neural network 320 and may generate a state of health estimation value of the battery 110 based on the plurality of output values.

For example, the state of health estimation unit 330 may multiply representative values of the plurality of health state sections each corresponding to the plurality of classes and the plurality of output values received from the artificial neural network 320 to compute a plurality of products and then add them (e.g., sum the plurality of products), thereby calculating a state of health estimation value. For example, when the first through fourth output values are 0, the fifth output value is 0.3 and the sixth output value is 0.7, 53% that is a value obtained by adding a value in which 60% as a representative value of the fifth health state section corresponding to the fifth class is multiplied by 0.3, and a value in which 50% as a representative value of the sixth health state section corresponding to the sixth class is multiplied by 0.7, may be determined as a state of health estimation value of the battery 110 from which the input data 310 is acquired.

Figure 4:
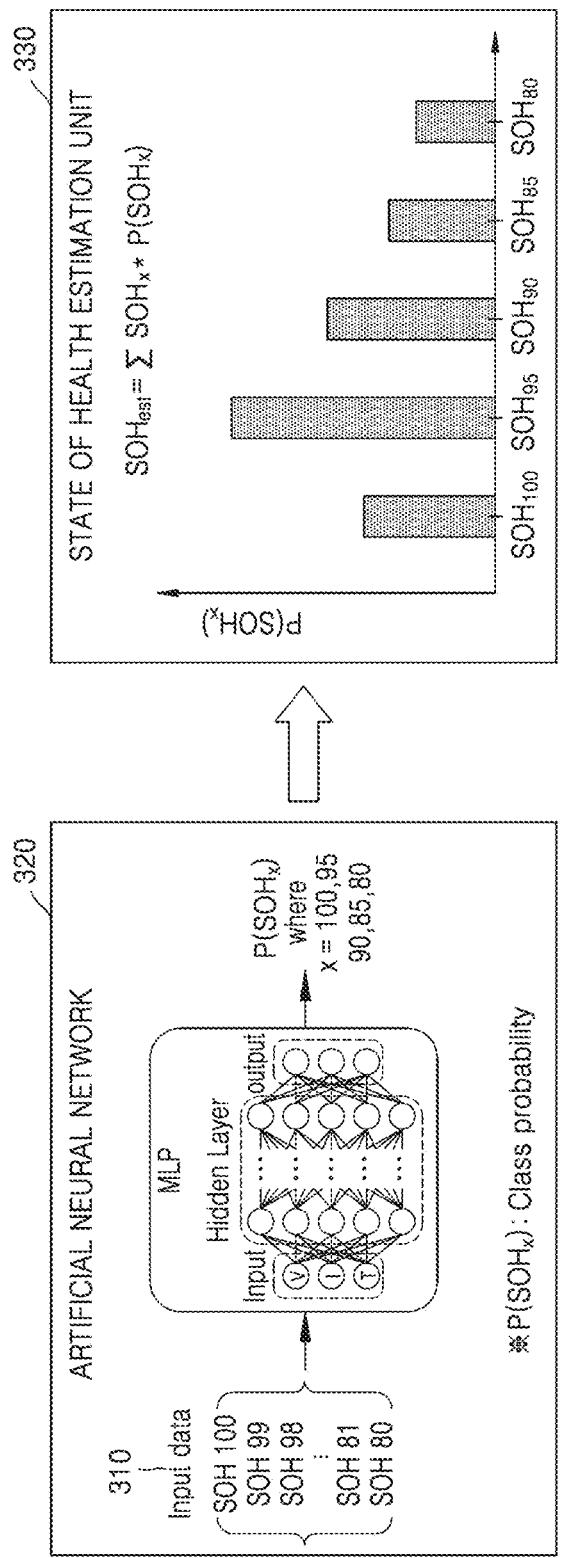
FIG. 4 is an exemplary diagram for explaining an operation of the processor according to an embodiment.

FIG. 4 is an exemplary diagram for explaining an operation of the processor 121 according to an embodiment.

Referring to FIG. 4, the input data 310 may be applied to the artificial neural network 320. The input data 310 may be time series data of measurement values obtained by measuring at least one parameter of the battery 110 with a preset sampling period. In some embodiments, the battery 110 may have a state of health in a range of 100% to 80%. In FIG. 4, "SOH x" shown as the input data 310 refers to the input data 310 generated from the battery 110 in a state of health of x %. In the present embodiment, the input data 310 includes voltage data V, current data I, and temperature data T of the battery 110.

The artificial neural network 320 may include an input layer, at least one hidden layer, and an output layer. The artificial neural network 320 may be generated based on a multi-layer perception (MLP), and the output layer may include a plurality of nodes. The output value output by the artificial neural network 320 may be a probability value P(SOHx) belonging to each (i.e., SOHx) of a plurality of classes. In the present embodiment, x is illustrated as 100, 95, 90, 85, and 80, and there may be 5 nodes of the output layer. In the present embodiment, the number of classes may be 5, and each of the classes may correspond to SOH100, SOH95, SOH90, SOH85, and SOH80. SOHx may be understood that its state of health is x % and it has a value of x %. The output values of the artificial neural network 320 may be probability values (P(SOH100), P(SOH95), P(SOH90), P(SOH85), P(SOH80)) belonging to SOH100, SOH95, SOH90, SOH85, and SOH80, respectively, as shown in the state of health estimation unit 330 of FIG. 4.

The state of health estimation unit 330 may determine a value obtained by adding the product of SOHx and P(SOHx) to all x, as a state of health estimation value SOHest of the battery 110 from which the input data 310 is extracted. For example, the state of health estimation value SOHest may be calculated by an equation such as Σ SOHx·P(SOHx).

Figure 5:
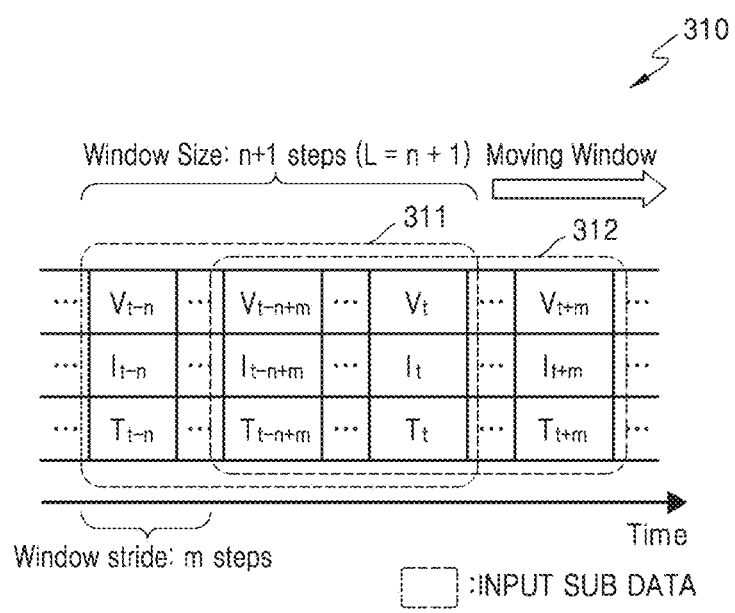
FIG. 5 is an exemplary diagram for explaining input data according to an embodiment.

FIG. 5 is an exemplary diagram for explaining the input data 310 according to an embodiment.

Referring to FIG. 5, the input data 310 may be generated from voltage values Vt, current values It, and temperature values Tt of the battery 110 measured for a preset sampling period (1 step). The input data 310 that is time series data may include voltage data V, current data I, and temperature data T of the battery 110, for example.

In an example, the input data 310 may have a preset window size (L=n+1 steps). The input data 310 may include L voltage values Vt-n, . . . , and Vt, L current values It-n, . . . , and It), and L temperature values Tt-n, . . . , and Tt.

In another example, the input data 310 may include a plurality of input sub data 311 and 312 identified by a preset window stride (m steps). Each of a plurality of input sub data 311 and 312 may be selected from the voltage values Vt, the current values Vt, and the temperature values Vt of the battery 110 measured for a preset sampling period (1 step) while moving the window by the window stride (m steps).

The input sub data 311 may include L voltage values Vt-n, . . . , and Vt, L current values It-n, . . . , and It, and L temperature values Tt-n, . . . , and Tt. The input sub data 312 may include L voltage values Vt-n+m, . . . , and Vt+m, L current values It-n+m, . . . , and It+m, and L temperature values Tt-n+m, . . . , and Tt+m. Because the window stride is m, another input sub data included in the input data 310 may include L voltage values Vt-n+2m, . . . , and Vt+2m, L current values It-n+2m, . . . , and It+2m, and L temperature values Tt-n+2m, . . . , and Tt+2m. The input sub data 311 and 312 may be repeated by (L-m)/L and different from each other by m/L. When the input data 310 includes the plurality of input sub data 311 and 312, because a noise component such as measurement noise is relatively reduced, the reliability and accuracy of the state of health estimation value SOHest may be further improved.

As an example, the window size L may be 180, and the window stride m may be 10 or 3, but embodiments of the present disclosure are not limited to these values.

Figure 6:
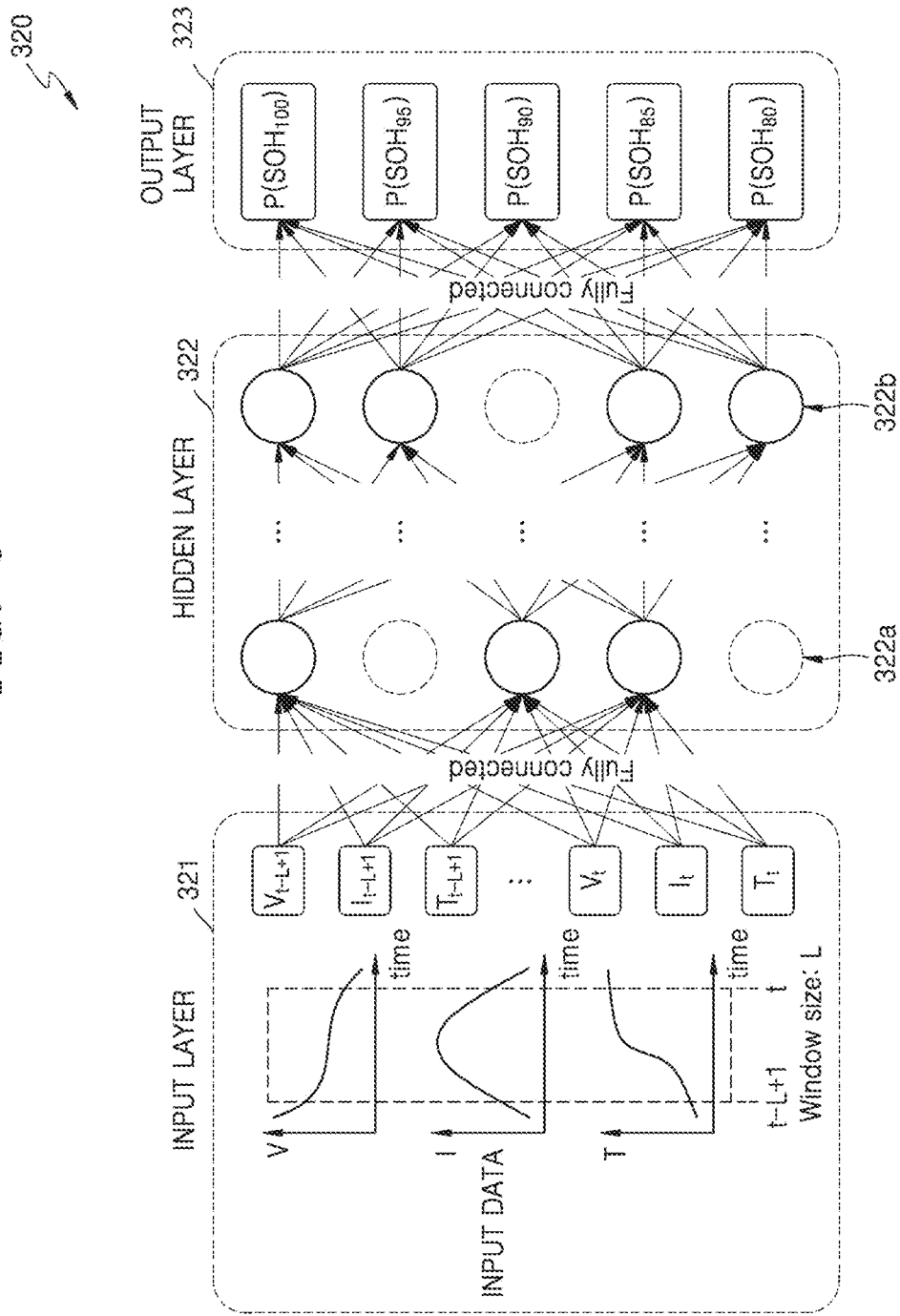
FIG. 6 is an exemplary diagram for explaining the artificial neural network 320 according to an embodiment.

FIG. 6 is an exemplary diagram for explaining the artificial neural network 320 according to an embodiment.

Referring to FIG. 6, the artificial neural network 320 may include an input layer 321, at least one hidden layer 322, and an output layer 323. The artificial neural network 320 may be generated based on a multi-layer perceptron (MLP) and trained in advance.

The input layer 321 may include a number of nodes corresponding to values of the input data 310. Because the window size of the input data 310 is L and the input data 310 includes voltage data, current data and temperature data, the input layer 321 may include 3L nodes.

At least one hidden layer 322 may be located between the input layer 321 and the output layer 323. The number of the hidden layers 322 may be 3 or 4, for example, but embodiments are not limited thereto. Nodes of a first hidden layer 322a may be completely connected to nodes of the input layer 321, and nodes of a last (or final) hidden layer 322b may be completely connected to nodes of the output layer 323. The first hidden layer 322a may include 2048 nodes as an example only, and the last hidden layer 322b may include 256 or 512 nodes as an example only.

The output layer 323 may have a number of nodes corresponding to the number of classes. In an example described above with reference to FIG. 4, the output layer 323 may include 5 output nodes SOH100, SOH95, SOH90, SOH85, and SOH80. However, this is as an example only, and the present disclosure is not limited to a particular number of nodes of the output layer 323.

The output layer 323 may include a softmax function that outputs a probability that the input data 310 belongs to each of the classes. In another example, when the input data 310 includes a plurality of input sub data, the output layer 323 may include a softmax function that outputs an average probability that each of the plurality of input sub data belongs to each of the classes. An output value ($P_{mean,k}$) of a k-th output node of the output layer 323 may be represented as the following equation using the softmax function.

$$P_{mean,k} = \frac{1}{N} \sum_{n=1}^{N} \left( \frac{e^{x_n^T w_k}}{\sum_{j=1}^{5} e^{w_n^T w_j}} \right)$$

Here, ($P_{mean,k}$) means an average value of a probability that the input sub data within the input data 310 belong to a k-th class. N is the number of the input sub data included in the input data 310, x is an input vector of the output layer 323, and xn is an input vector of the output layer 323 when input sub data corresponding to n is input. w is a weight matrix between the last hidden layer 322b and the output layer 323, and $w_k$ is a weight matrix between nodes of the last hidden layer 322b and a k-th node of the output layer 323. The above equation is an equation when the number of classes is 5.

The state of health estimation unit (330 of FIG. 4) may determine a state of health estimation value $E_{SOH}$ using the output value ($P_{mean,k}$) output from the output nodes of the output layer 323. For example, the state of health estimation value $E_{SOH}$ may be calculated by the following equation.

$$E_{SOH} = SOH^T \cdot P_{mean}.$$

Here, the vector SOH is a vector of first through k-th SOH values each corresponding to first through k-th classes, and a vector $P_{mean}$ is a vector of the output value ($P_{mean,k}$). For example, in the above example, the vector SOH may be (100, 95, 90, 85, 50), and the vector $P_{mean}$ may be ($P_{mean,1}$, $P_{mean,2}$, $P_{mean,3}$, $P_{mean,4}$, $P_{mean,5}$).

Hereinafter, a method of preparing an artificial neural network trained in advance will be described.

Figure 7:
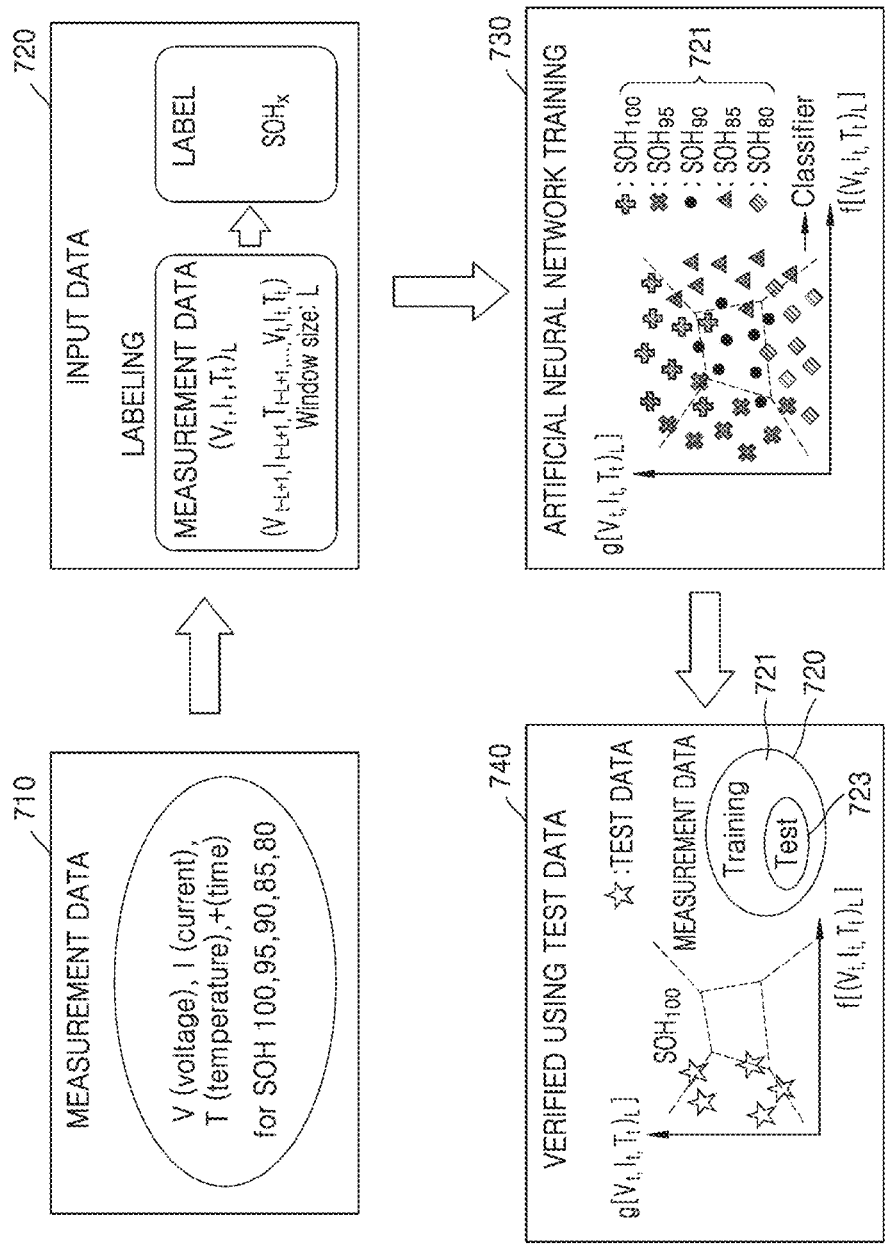
FIG. 7 is an exemplary diagram for explaining a method of training an artificial neural network according to an embodiment.

FIG. 7 is an exemplary diagram for explaining a method of training the artificial neural network 320 according to an embodiment.

Referring to FIG. 7, an artificial neural network (320 of FIG. 6) to be trained may be prepared. The artificial neural network 320 may be designed, as shown in FIG. 6, for example.

Measurement data 710 obtained by measuring at least one parameter of the battery 110 may be obtained in each of a plurality of preset health state sections. The plurality of health state sections may be preset, for example, as a first health state section of 99.5% to 100%, a second health state section of 94.5% to 95.5%, a third health state section of 89.5% to 90.5%, a fourth health state section of 84.5% to 85.5%, and a fifth health state section of 79.5% to 80.5%. At least one parameter may be, for example, voltage, current, and temperature. The measurement data 710 may be time series data obtained from the battery 110 having a known state of health value at a preset sampling period. The measurement data 710 may include voltage data including voltage values listed in chronological order, current data including current values listed in chronological order, and temperature data listed in chronological order, as shown in FIG. 5.

According to an embodiment, the measurement data 710 may include voltage values, current values, and temperature values measured by charging and discharging the battery 110 according to a preset charging/discharging profile. The charging/discharging profile may include charging a constant current at 1 C, charging a constant voltage to 4.1 V when a cell voltage reaches 4.1 V, and stopping charging and pausing for 10 minutes when a charging current reaches 145 mA. The charging/discharging profile may include discharging a constant current at 0.5 C or 1 C and stopping discharging and pausing for 10 minutes when the cell voltage reaches 3.0 V.

Input data 720 may be generated based on measurement data 710. Part of the input data 720 may be training data 721, and the other part thereof may be test data 723. The input data 720 may be generated by selecting data corresponding to a window size of L and then labeling a known state of health value, as shown in FIG. 5.Ia The input data 720 may be (Vt−L+1, It−L+1, Tt−L+1, Vt, It, Tt), and a state of health value SOHx of a battery from which corresponding measurement values are acquired, may be labeled. The input data 720 may be represented as $(Vt, It, Tt)_L$. The state of health value may be labeled on the input data 720 in the form of an identification number of a corresponding class among a plurality of classes.

The artificial neural network 320 may be trained using the training data 721 of the input data 720. As shown in FIG. 7, the artificial neural network 320 may classify the training data 721 each corresponding to the first through fifth health state sections. Training 730 may be performed so that the artificial neural network 320 may identify the training data. The training 730 may be performed when the artificial neural network 320 repeatedly performs a process of determining internal weights so that a preset error may be minimized. In FIG. 7, $SOH_{100}$ means training data labeled with the state of health value of 100%.

As shown in FIG. 7, the trained artificial neural network 320 may be verified (740) using the test data 723. The result of inputting the test data 723 into the trained artificial neural network 320 may be compared with a state of health value labeled on the test data 723.

According to the present disclosure, the artificial neural network 320 is trained. The measurement data 710 may be acquired only from a preset heath state section without acquiring the measurement data 710 for all health state sections. In order to acquire the measurement data 710 and to know the state of health value of the battery 110 from which the measurement data 710 is acquired, a reference performance test (RPT) needs to be performed each time. Considerable time and cost are required to perform the reference performance test (RPT). The RPT may include an initialization step and a capacity measuring step. The initialization step may include charging the battery at 1 C for one hour and pausing for one hour. The capacity measuring step may include discharging the battery at 0.04 C for 25 hours, pausing for one hour, charging the battery at 0.04 C for 25 hours, and pausing for one hour. The RPT may take a total of 54 hours. The battery 110 may also be deteriorated in a process of performing the RPT. According to the present disclosure, because the measurement data 710 is acquired only for the preset health state section, the number of the RPTs that require considerable time and cost may be reduced.

Figure 8A:
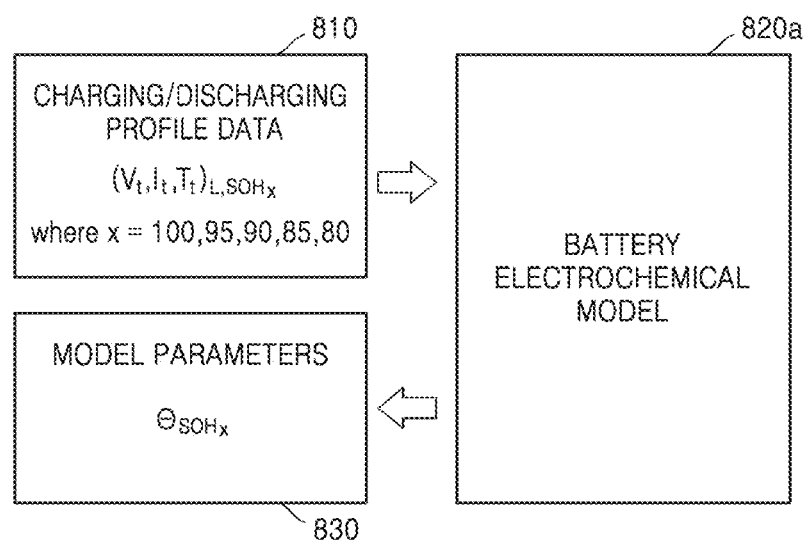
FIGS. 8A and 8B are diagrams for explaining a method of synthesizing input data according to an embodiment.
Figure 8B:
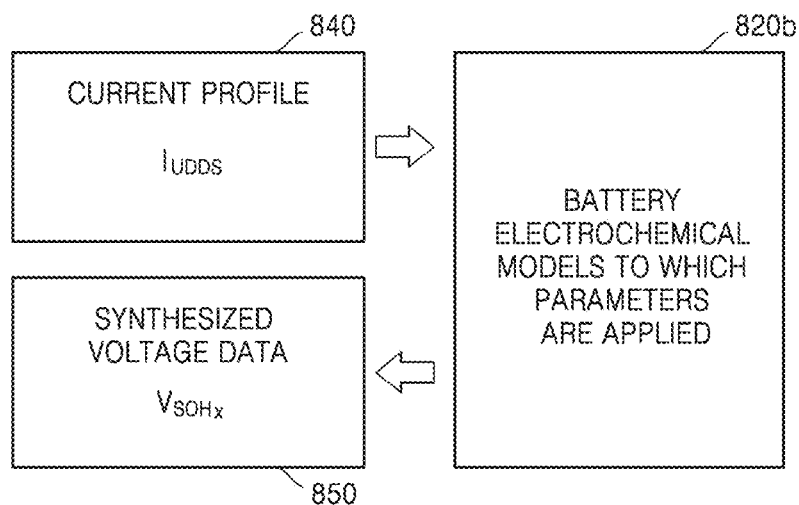

FIGS. 8A and 8B are diagrams for explaining a method of synthesizing the input data 720 according to an embodiment.

Referring to FIG. 8A, a battery electrochemical model 820a including model parameters may be generated. According to an embodiment, a charging/discharging profile data 810 may include voltage values, current values, and temperature values measured by charging and discharging the battery 110 according to the preset charging/discharging profile. The charging/discharging profile data 810 may correspond to the input data 720 of FIG. 7. The state of health value SOHx may be labeled on the charging/discharging profile data 810.

The battery electrochemical model 820a may be input into the charging/discharging profile data 810 labeled with the state of health value SOHx, and the model parameter values 830 corresponding to the state of health value SOHx may be determined using an optimization algorithm such as harmony search, for example. Model parameter values $\Theta_{SOHx}$ each corresponding to the state of health values SOHx may be determined.

Model parameters of the battery electrochemical model 820a may be selected from the group consisting of, for example, solid particle potential, electrolyte potential effective solid particle conductivity, solid particle conductivity, thickness, applied current, ion flux, solid particle surface area, solid particle radius, electrode surface area, effective solid particle diffusion coefficient, solid particle diffusion coefficient, effective electrolyte diffusion coefficient, lithium concentration within solid particles, lithium ion concentration within electrolyte, maximum solid particle concentration, surface concentration, and electrolyte diffusion coefficient.

Referring to FIG. 8B, electrochemical models 820 to which the model parameter values $\Theta_{SOHx}$ each corresponding to the state of health values SOHx are applied, may be prepared. By inputting current data according to the preset current profile 840 into the electrochemical models 820b to which the model parameters $\Theta SOHx$ are applied, synthesized voltage data $V_{SOHx}$ each corresponding to the state of health values SOHx may be generated. In addition, synthesized temperature data $T_{SOHx}$ each corresponding to the state of health values SOHx may be generated together.

The input data 720 of FIG. 7 may be generated using the current data, the synthesized voltage data $V_{SOHx}$ and the synthesized temperature data $T_{SOHx}$ according to the preset current profile 840 instead of the measurement data 710.

Figure 9A:
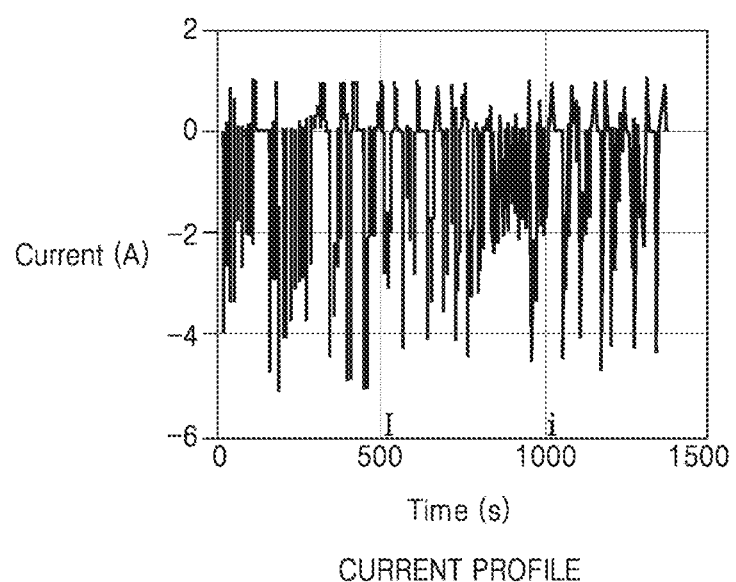
FIG. 9A illustrates an exemplary current profile.
Figure 9B:
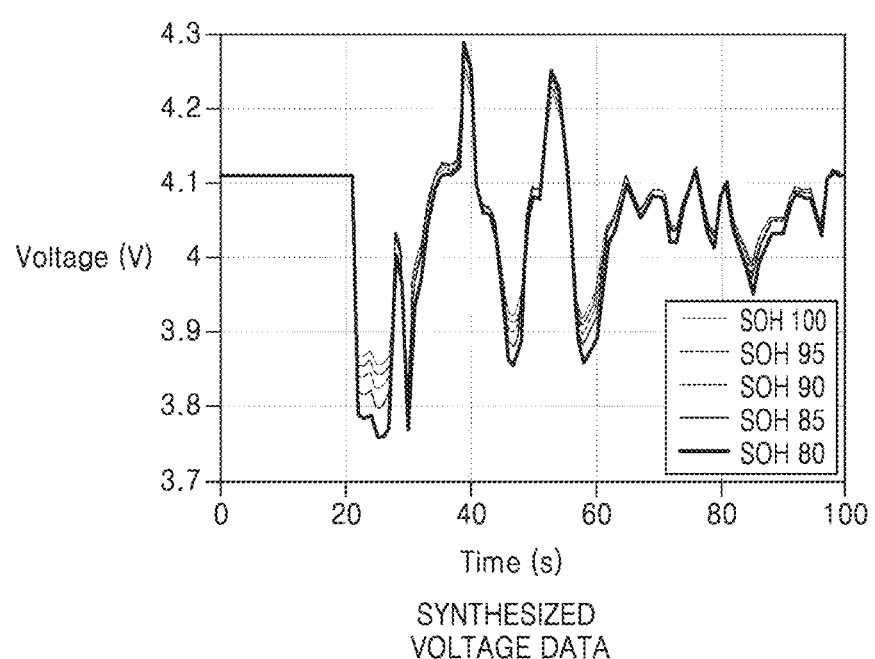
FIGS. 9B and 9C illustrate synthesized voltage data and synthesized temperature data generated by inputting the current profile of FIG. 9A into electrochemical models to which model parameter values each corresponding to the state of health values of FIG. 8B are applied.
Figure 9C:
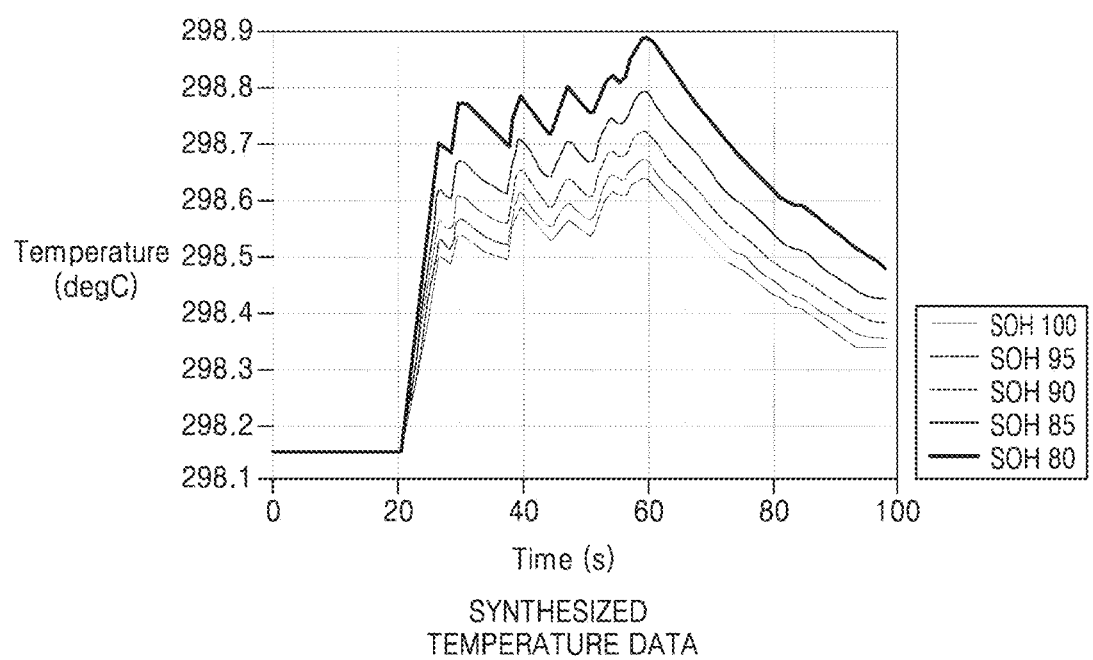

The preset current profile 840 may be set according to the use pattern of an apparatus to which the battery 110 will be applied. For example, in the case of the battery 110 to be used to power an electric vehicle, the current profile 840 may be generated using a standard speed profile of the vehicle. FIG. 9A illustrates an exemplary current profile. FIGS. 9B and 9C illustrate synthesized voltage data and synthesized temperature data generated by inputting the current profile of FIG. 9A into the electrochemical models 820b to which model parameter values $\Theta_{SOHx}$ each corresponding to the state of health values SOHx of FIG. 8B are applied.

Figure 10A:
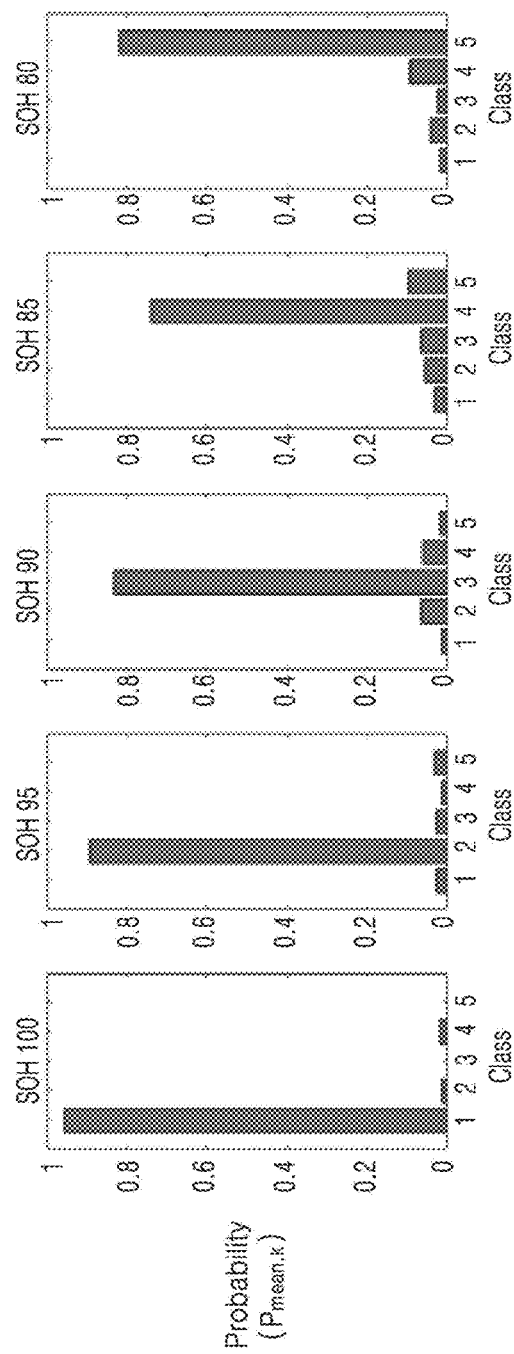
FIGS. 10A and 10B illustrate a class probability distribution of an artificial neural network trained using measurement data acquired according to the charging/discharging profile according to an embodiment.
Figure 10B:
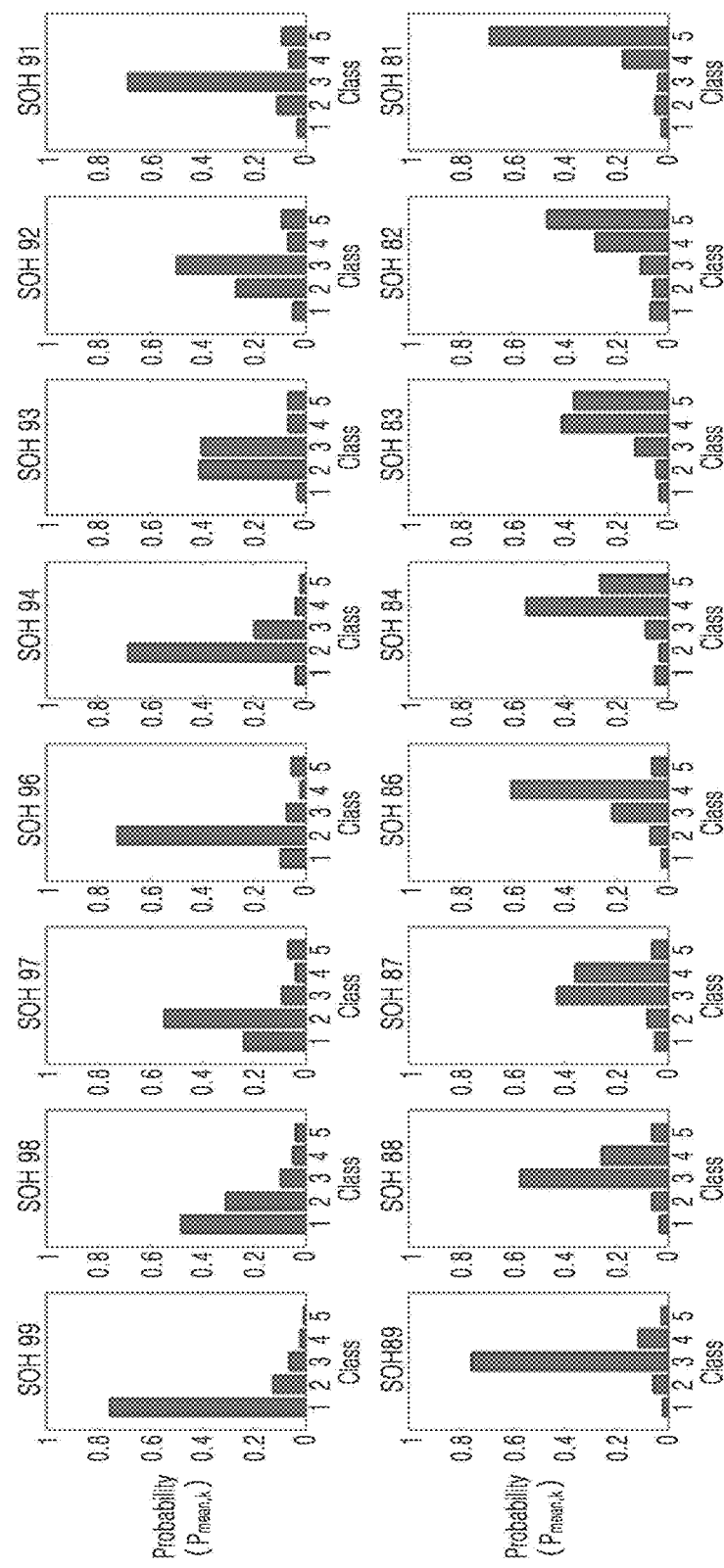

FIGS. 10A and 10B illustrate a class probability distribution of an artificial neural network trained using the measurement data 710 acquired according to the charging/discharging profile according to an embodiment.

Referring to FIG. 10A, class 1 corresponds to a first health state section of 99.5% to 100%, class 2 corresponds to a second health state section of 94.5% to 95.5%, class 3 corresponds to a third health state section of 89.5% to 90.5%, class 4 corresponds to a fourth health state section of 84.5% to 85.5%, and class 5 corresponds to a fifth health state section of 79.5% to 80.5%.

The graph labeled SOH 100 represents the result of inputting input data acquired from a battery having a state of health state belonging to a first health state section into an artificial neural network. As shown, a probability of belonging to class 1 may be highest, and a probability of belonging to class 2 may be very low. The graph labeled SOH 95 represents the result of inputting input data acquired from a battery having a state of health state belonging to a second health state section into the artificial neural network. As shown, a probability of belonging to class 2 may be highest, and a probability of belonging to the other classes may be very low. The graph labeled SOH 90 represents the result of inputting input data acquired from a battery having a state of health state belonging to a third health state section into the artificial neural network. As shown, a probability of belonging to class 3 may be highest, and a probability of belonging to the other classes may be very low. The graph labeled SOH 85 represents the result of inputting input data acquired from a battery having a state of health state belonging to a fourth health state section into the artificial neural network. As shown, a probability of belonging to class 4 may be highest, and a probability of belonging to the other classes may be very low. The graph labeled SOH 80 represents the result of inputting input data acquired from a battery having a state of health state belonging to a fifth health state section into the artificial neural network. As shown, a probability of belonging to class 5 may be highest, and a probability of belonging to the other classes may be very low.

FIG. 10B illustrates the result of inputting input data acquired from a battery having state of health values other than 100%, 95%, 90%, 85%, and 80% into an artificial neural network. As shown in FIG. 10B, when input data corresponding to a particular state of health value is input, the probability of classes adjacent to (e.g., closest to) the particular state of health value may be high, and the probability of a closer or more adjacent class may be higher.

The state of health estimation unit (330 of FIG. 4) for generating a state of health estimation value using the result of the artificial neural network may calculate the state of health estimation value using an equation such as $\Sigma \text{SOHx} \cdot P(\text{SOHx})$. When calculating in this way, an average error rate between an actual state of health value and a state of health estimation value was 1.6%, and a maximum error rate was 3.8%.

Figure 11B:
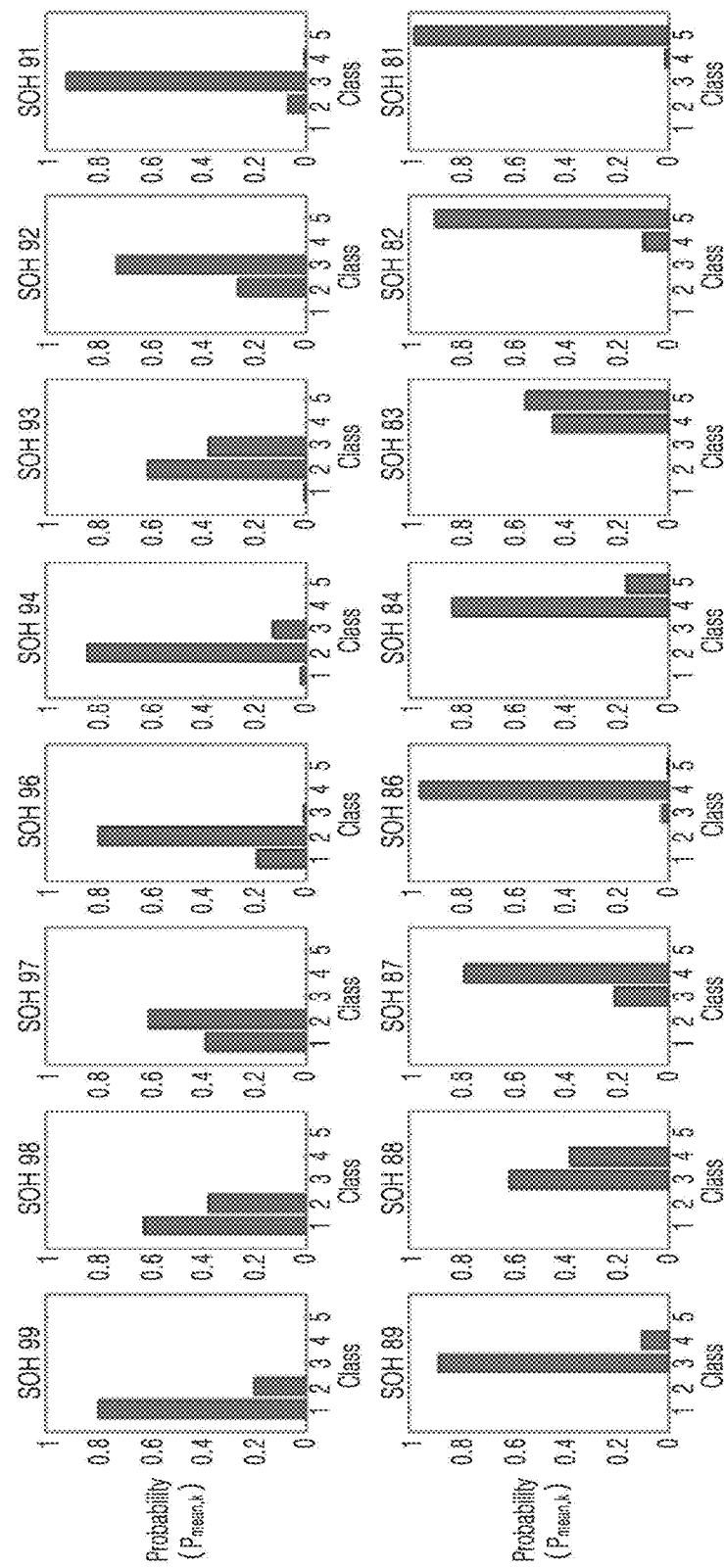

FIGS. 11A and 11B illustrate a class probability distribution of an artificial neural network trained using synthesized input data including current data, synthetized voltage data, and synthesized temperature data according to a current profile according to an embodiment.

The result shown in FIG. 11A was similar to the result shown in FIG. 10A, and the result shown in FIG. 11B was also similar to the result shown in FIG. 10B. When using the synthesized input data, an average error rate between an actual state of health value and a state of health estimation value was 0.49%, and a maximum error rate was 1.87%.

According to the present disclosure, the number of reference performance tests required for training an artificial neural network can be reduced. According to some related art, more than 20 reference performance tests have to be performed, but according to some embodiments of the present disclosure, 5 reference performance tests may be performed (e.g., 5 reference performance tests are sufficient). Despite this reduced number of reference performance tests, even when the artificial neural network was designed to output a probability of belonging to each class and a state of health estimation value was calculated using the probability, an error with an actual state of health value was approximately 1%, and a maximum error was also less than 4%. Thus, according to the present disclosure, the state of health of the battery can be accurately estimated in real time using an artificial neural network trained based on data that may be measured directly from the battery in use.

The various embodiments described above are exemplary, and are not to be performed independently as they are distinguished from each other. The embodiments described in the present specification may be embodiment in a combined form.

The various embodiments described above may be implemented in the form of a computer program that may be executed using various components on a computer, and such a computer program may be recorded on a computer-readable medium. In this case, the medium may continuously store a program executable by the computer, or temporarily store a program for execution or download. In addition, the medium may be a variety of recording means or storage means in the form of a combination of single or several hardware. It is not limited to a medium directly connected to the computer system, and may be distributed on a network. Examples of the medium include magnetic media such as hard disks, floppy disks, and magnetic tapes, optical recording media such as CD-ROMs and DVDs, magneto-optical media such as floptical disks, and ROM, RAM, flash memory, and the like and may be configured to store program instructions. In addition, as examples of other media, there may be recording media or storage media managed at an app store that distributes applications or a site that supplies or distributes various software, or a server.

In the present specification, "unit," "module," etc. may be a hardware component such as a processor or circuit, and/or a software component executed by a hardware configuration such as a processor. For example, "unit," "module," etc. may be implemented by components such as software components, object-oriented software components, class components and task components, processes, functions, properties, procedures, subroutines, segments of a program code, drivers, firmware, microcode, circuitry, data, database, data structures, tables, arrays and variables.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method performed by at least one computing apparatus, the method comprising:
preparing a trained artificial neural network;
generating input data by measuring at least one parameter of a battery;
acquiring a plurality of output values corresponding to a plurality of classes by inputting the input data into the trained artificial neural network; and generating a state of health estimation value of the battery using a plurality of preset health state sections corresponding to the plurality of classes and the plurality of output values corresponding to the plurality of classes, wherein the state of health estimation value of the battery is calculated by multiplying representative values of the plurality of health state sections corresponding to the plurality of classes and the plurality of output values corresponding to the plurality of classes to compute a plurality of products and summing the plurality of products.

2. The method of claim 1, wherein the at least one parameter comprises a voltage of the battery and a current of the battery.

3. The method of claim 1, wherein the at least one parameter comprises a voltage of the battery, a current of the battery, and a temperature of the battery.

4. The method of claim 1, wherein the generating of the input data comprises:
measuring the at least one parameter of the battery in operation in accordance with a preset sampling period; and
generating the input data based on measurement values of the at least one parameter measured for a preset first time.

5. The method of claim 1, wherein the generating of the input data comprises:
generating measurement values of the at least one parameter by measuring the at least one parameter of the battery in operation in accordance with a preset sampling period;
generating a plurality of input sub data based on measurement values of the at least one parameter generated for a preset first time after a preset second time has elapsed; and
generating the input data based on the plurality of input sub data.

6. The method of claim 1, wherein the plurality of output values corresponding to the plurality of classes are probability values that the input data belongs to each of the plurality of classes.

7. A method performed by at least one computing apparatus, the method comprising:
preparing a trained artificial neural network;
generating input data by measuring at least one parameter of a battery;
acquiring a plurality of output values corresponding to a plurality of classes by inputting the input data into the trained artificial neural network; and
generating a state of health estimation value of the battery using a plurality of preset health state sections corresponding to the plurality of classes and the plurality of output values corresponding to the plurality of classes,
wherein the preparing of the trained artificial neural network comprises:
generating an artificial neural network;
preparing measurement data acquired by measuring the at least one parameter of the battery in each of the plurality of preset health state sections;
generating a plurality of training data labeled with a class of the plurality of classes to which they belong, based on the measurement data and the corresponding preset health state sections; and
training the artificial neural network using the plurality of training data to prepare the trained artificial neural network.

8. The method of claim 7, wherein the preparing of the plurality of training data comprises:
preparing a battery electrochemical model including model parameters;
generating a plurality of model parameter data of the battery electrochemical model each corresponding to the plurality of preset health state sections using the measurement data;
generating a plurality of synthesized voltage data each corresponding to the plurality of preset health state sections by inputting a plurality of current data into the battery electrochemical model to which each of the plurality of model parameter data is applied; and
generating the plurality of training data based on the current data and the plurality of synthesized voltage data.

9. The method of claim 8, wherein the preparing of the plurality of training data comprises:
further generating a plurality of synthesized temperature data each corresponding to the plurality of preset health state sections by inputting current data into the battery electrochemical model to which each of the plurality of model parameter data is applied; and
generating the plurality of training data based on the current data, the plurality of synthesized voltage data, and the plurality of synthesized temperature data.

10. The method of claim 7, wherein the artificial neural network is generated based on a multi-layer perceptron (MLP).

11. The method of claim 1, wherein
the trained artificial neural network comprises an input layer, at least one hidden layer, and an output layer, and
the output layer comprises a softmax function that outputs a probability that the input data input into the input layer belongs to each of the plurality of classes.

12. An apparatus for estimating a state of health of a battery, the apparatus comprising:
memory configured to store input data generated by measuring a trained artificial neural network and at least one parameter of the battery; and
at least one processor configured to acquire a plurality of output values corresponding to a plurality of classes by inputting the input data into the trained artificial neural network and to estimate a state of health estimation value of the battery using a plurality of preset health state sections corresponding to the plurality of classes and the plurality of output values corresponding to the plurality of classes,
wherein
the input data is generated based on a plurality of input sub data, and
the plurality of input sub data are generated based on measurement values of the at least one parameter generated by measuring the at least one parameter of the battery in operation in accordance with a preset sampling period, and
each of the plurality of input sub data is generated based on measurement values of the at least one parameter generated for a preset first time after a preset second time has elapsed.

13. The apparatus of claim 12, wherein the at least one parameter comprises a voltage of the battery and a current of the battery or comprises a voltage of the battery, a current of the battery, and a temperature of the battery.

14. The apparatus of claim 12, wherein the input data is generated based on measurement values of the at least one parameter generated by measuring the at least one parameter of the battery in operation in accordance with a preset sampling period for a preset first time.

15. The apparatus of claim 12, wherein the plurality of output values corresponding to the plurality of classes are probability values that the input data belongs to each of the plurality of classes.

16. The apparatus of claim 12, wherein the state of health estimation value of the battery is calculated by multiplying representative values of the plurality of health state sections each corresponding to the plurality of classes and the plurality of output values each corresponding to the plurality of classes to compute a plurality of products and summing the plurality of products.

17. The apparatus of claim 12, wherein
the trained artificial neural network comprises an input layer, at least one hidden layer, and an output layer, and
the output layer comprises a softmax function that outputs a probability that the input data input into the input layer belongs to each of the plurality of classes.

18. A computer program stored in a medium so as to perform the method of claim 1 using a computing apparatus.

\* \* \* \* \*